(12) United States Patent
Ishibashi

(10) Patent No.: US 9,728,612 B2
(45) Date of Patent: *Aug. 8, 2017

(54) SILICON CARBIDE SUBSTRATE, SEMICONDUCTOR DEVICE AND METHODS FOR MANUFACTURING THEM

(71) Applicant: Sumitomo Electric Industries, Ltd., Osaka-shi, Osaka (JP)

(72) Inventor: Keiji Ishibashi, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/239,255

(22) Filed: Aug. 17, 2016

(65) Prior Publication Data

US 2016/0359007 A1 Dec. 8, 2016

Related U.S. Application Data

(63) Continuation of application No. 14/751,724, filed on Jun. 26, 2015, which is a continuation of application (Continued)

(30) Foreign Application Priority Data

Jul. 20, 2011 (JP) .................................. 2011-158608

(51) Int. Cl.
*H01L 29/49* (2006.01)
*H01L 29/36* (2006.01)
(Continued)

(52) U.S. Cl.
CPC .............. *H01L 29/36* (2013.01); *B28D 5/045* (2013.01); *H01L 21/046* (2013.01); *H01L 29/04* (2013.01);
(Continued)

(58) Field of Classification Search
CPC ... H01L 29/1608; H01L 29/04; H01L 29/045; H01L 29/36; H01L 29/6606; H01L 29/868; H01L 29/872
See application file for complete search history.

(56) References Cited

U.S. PATENT DOCUMENTS 6,053,973 A 4/2000 Tanino et al.
6,530,991 B2 3/2003 Tanaka et al.
(Continued)

FOREIGN PATENT DOCUMENTS

CN 1623894 A 6/2005
CN 1829830 A 9/2006
(Continued)

OTHER PUBLICATIONS

R.C. Glass et al., "SiC Seeded Crystal Growth," Phys. stat. sol. (b) 202, 1997, pp. 149-162.
(Continued)

*Primary Examiner* — Michael Shingleton
(74) *Attorney, Agent, or Firm* — Drinker Biddle & Reath LLP

(57) ABSTRACT

A silicon carbide substrate capable of reducing on-resistance and improving yield of semiconductor devices is made of single-crystal silicon carbide, and sulfur atoms are present in one main surface at a ratio of not less than $60 \times 10^{10}$ atoms/$cm^2$ and not more than $2000 \times 10^{10}$ atoms/$cm^2$, and oxygen atoms are present in the one main surface at a ratio of not less than 3 at % and not more than 30 at %.

14 Claims, 5 Drawing Sheets

Related U.S. Application Data

No. 13/540,673, filed on Jul. 3, 2012, now Pat. No. 9,105,756.

(60) Provisional application No. 61/509,686, filed on Jul. 20, 2011.

(51) Int. Cl.

| | | |
|---|---|---|
| *H01L 29/66* | (2006.01) | |
| *H01L 29/868* | (2006.01) | |
| *H01L 29/04* | (2006.01) | |
| *H01L 29/16* | (2006.01) | |
| *B28D 5/04* | (2006.01) | |
| *H01L 21/04* | (2006.01) | |

(52) U.S. Cl.
CPC ........ *H01L 29/045* (2013.01); *H01L 29/1608* (2013.01); *H01L 29/6606* (2013.01); *H01L 29/868* (2013.01)

(56) References Cited

U.S. PATENT DOCUMENTS

| | | | |
|---|---|---|---|
| 8,057,174 | B2 | 11/2011 | Scholte-Wassink |
| 8,058,174 | B2 | 11/2011 | Narendar et al. |
| 9,184,246 | B2 | 11/2015 | Ishibashi |
| 2001/0012678 | A1 | 8/2001 | Tanaka et al. |
| 2003/0080384 | A1 | 5/2003 | Takahashi et al. |
| 2005/0079359 | A1 | 4/2005 | Fujita et al. |
| 2006/0234058 | A1 | 10/2006 | Ohmi et al. |
| 2006/0267024 | A1 | 11/2006 | Murphy et al. |
| 2008/0197360 | A1 | 8/2008 | Sriram et al. |
| 2010/0065857 | A1 | 3/2010 | Harada et al. |
| 2010/0080956 | A1 | 4/2010 | Fujimoto et al. |
| 2010/0221917 | A1 | 9/2010 | Masuda |
| 2011/0031589 | A1 | 2/2011 | Ishibashi |
| 2011/0156058 | A1 | 6/2011 | Hori et al. |
| 2011/0183113 | A1 | 7/2011 | Sakaguchi |
| 2012/0068155 | A1 | 3/2012 | Ishibashi |
| 2013/0020585 | A1 | 1/2013 | Ishibashi |
| 2013/0256700 | A1 | 10/2013 | Ishibashi |
| 2016/0020281 | A1 | 1/2016 | Ishibashi |

FOREIGN PATENT DOCUMENTS

| | | |
|---|---|---|
| CN | 1892984 A | 1/2007 |
| CN | 101336473 A | 12/2008 |
| CN | 101484616 A | 7/2009 |
| CN | 101536192 A | 9/2009 |
| CN | 1973064 B | 10/2010 |
| CN | 102165563 A | 8/2011 |
| JP | 09-301799 | 11/1997 |
| JP | 10-194896 | 7/1998 |
| JP | 2003-282451 A | 10/2003 |
| JP | 2004-363398 A | 12/2004 |
| JP | 2005-47753 | 2/2005 |
| JP | 2006-327931 A | 12/2006 |
| JP | 2008-174841 A | 7/2008 |
| JP | 2008-290898 A | 12/2008 |
| JP | 2009-188100 A | 8/2009 |
| JP | 2010-163307 A | 7/2010 |
| JP | 2011-505701 A | 2/2011 |
| JP | 2011-071204 A | 4/2011 |
| JP | 2011-77381 | 4/2011 |
| JP | 2011-077382 A | 4/2011 |
| JP | 2011-077497 A | 4/2011 |
| JP | 5803786 B2 | 11/2015 |
| WO | WO-2006-011976 A1 | 2/2006 |
| WO | WO-2006-041660 A2 | 4/2006 |
| WO | WO-2008-005636 A1 | 1/2008 |
| WO | WO-2010/090024 A1 | 8/2010 |

OTHER PUBLICATIONS

U.S. Office Action dated Feb. 25, 2014 that issued in U.S. Appl. No. 13/776,890 including Double Patenting Rejections on pp. 10-13.

Office Action issued Jul. 29, 2015 in Chinese Patent Application No. 201280030621.3 (6 pages) with English Translation (9 pages).

Decision to Grant Patent mailed Apr. 26, 2016 in Japanese Patent Application No. 2015-172863 (3 pages) with an English Translation (3 pages).

Decision to Grant Patent issued May 10, 2016 in Japanese Patent Application No. 2015-165739 (3 pages) with an English Translation (3 pages).

Submission of Terminal Disclaimer Pursuant to Examiner-Initiated Interview filed Apr. 15, 2016 in U.S. Appl. No. 14/ 870,777 pertaining to Double Patenting Rejections.

Chen et al. (2005) "Atomic structure of the 6H-SiC(0001) nanomesh," Surface Science, 596:176-186.

Shen et al. (2010) "Excess carbon in silicon carbide," Journal of Applied Physics 108:1-5.

SILICON CARBIDE SUBSTRATE, SEMICONDUCTOR DEVICE AND METHODS FOR MANUFACTURING THEM

CROSS-REFERENCE TO RELATED APPLICATIONS

This application is a continuation application of U.S. patent application Ser. No. 14/751,724, filed Jun. 26, 2015, which is a continuation application of U.S. patent application Ser. No. 13/540,673, filed Jul. 3, 2012, now U.S. Pat. No. 9,105,756, issued Aug. 11, 2015, which claims the benefit of U.S. Provisional Application No. 61/509,686 filed Jul. 20, 2011 and Japanese Patent Application No. 2011-158608, filed Jul. 20, 2011, the entirety of each are herein incorporated by reference.

BACKGROUND OF THE INVENTION

Field of the Invention

The present invention relates to a silicon carbide substrate, a semiconductor device, and methods for manufacturing them. More particularly, the present invention relates to a silicon carbide substrate capable of reducing on-resistance and improving yield of semiconductor devices, a semiconductor device using the substrate, and methods for manufacturing them.

Description of the Background Art

In recent years, in order to achieve high breakdown voltage, low loss, and utilization of semiconductor devices under a high temperature environment, silicon carbide (SiC) has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously. In addition, a silicon carbide substrate is more excellent in heat conductivity than a substrate made of a nitride semiconductor such as a gallium nitride substrate, and thus it is excellent as a substrate of a semiconductor device for high power application for which high voltage and large current are required.

In order to manufacture a high-performance semiconductor device adopting silicon carbide as its material, it is effective to employ a process of preparing a substrate made of silicon carbide (silicon carbide substrate), and forming an epitaxial growth layer made of SiC on the silicon carbide substrate. Further, when manufacturing, for example, a vertical type power device using the silicon carbide substrate, on-resistance of the device can be reduced by reducing resistivity of the substrate in the thickness direction thereof as much as possible. Further, in order to reduce the resistivity of the substrate in the thickness direction thereof, for example, there can be employed a method of introducing an impurity, which is an n type dopant such as nitrogen, into the substrate at a high concentration (for example, see R. C. GLASS et al., "SiC Seeded Crystal Growth", Phys. stat. sol. (b), 1997, 202, pp. 149-162 (Non-Patent Literature 1)). In addition, influence of an impurity present in a surface of a Group III nitride substrate having a crystal structure different from that of silicon carbide has been studied (see Japanese Patent Laying-Open No. 2011-77381 (Patent Literature 1), Japanese Patent Laying-Open No. 2010-163307 (Patent Literature 2)).

However, even if a semiconductor device is manufactured using a silicon carbide substrate having a low resistivity, there may occur a problem that on-resistance of the semiconductor device is increased and causes a reduction in yield.

SUMMARY OF THE INVENTION

The present invention has been made to solve such a problem, and one object of the present invention is to provide a silicon carbide substrate capable of reducing on-resistance and improving yield of semiconductor devices, a semiconductor device using the substrate, and methods for manufacturing them.

In a silicon carbide substrate in accordance with the present invention, a region including at least one main surface is made of single-crystal silicon carbide, and sulfur atoms are present in the one main surface at not less than $60 \times 10^{10}$ atoms/cm$^2$ and not more than $2000 \times 10^{10}$ atoms/cm$^2$, and oxygen atoms are present in the one main surface at not less than 3 at % and not more than 30 at %.

The inventor of the present invention has studied causes of a reduction in yield of semiconductor devices due to the increase in on-resistance described above, and countermeasures therefor. As a result, the inventor has found that the increase in on-resistance is caused by the presence of an impurity element in a main surface of a silicon carbide substrate on which an epitaxial growth layer is to be formed. The inventor has also obtained a finding that the degree of influence on the on-resistance significantly differs depending on the type of the impurity element.

Specifically, if carbon atoms are present in a main surface of a silicon carbide substrate, when an epitaxial growth layer is formed on the main surface, a high-resistivity layer is formed at an interface between the silicon carbide substrate and the epitaxial growth layer, and on-resistance of a semiconductor device obtained thereafter by forming electrodes and the like is significantly increased. On the other hand, if sulfur atoms and oxygen atoms are present in large amounts in a main surface of a silicon carbide substrate, they cause an increase in on-resistance, but if they are present in small amounts, they have less influence. Further, the presence of sulfur atoms and oxygen atoms suppresses binding between silicon atoms constituting the silicon carbide substrate and carbon atoms as an impurity element. Therefore, the presence of sulfur atoms and oxygen atoms in small amounts has an effect of suppressing the presence of carbon atoms as an impurity element and suppressing an increase in on-resistance.

In the silicon carbide substrate in accordance with the present invention, since presence ratios of sulfur atoms and oxygen atoms in the main surface are set to not more than $2000 \times 10^{10}$ atoms/cm$^2$ and not more than 30 at %, respectively, an increase in on-resistance due to the presence of these atoms is suppressed. In addition, since the presence ratios of the sulfur atoms and the oxygen atoms in the main surface are set to not less than $60 \times 10^{10}$ atoms/cm$^2$ and not less than 3 at %, respectively, binding between silicon atoms constituting the silicon carbide substrate and carbon atoms as an impurity is suppressed, and an increase in on-resistance is suppressed. As a result, according to the silicon carbide substrate in accordance with the present invention, a silicon carbide substrate capable of reducing on-resistance and improving yield of semiconductor devices can be provided.

In the silicon carbide substrate, chlorine atoms may be present in the one main surface at not more than $4000 \times 10^{10}$ atoms/cm$^2$. Thereby, a silicon carbide substrate capable of reducing on-resistance and improving yield of semiconductor devices can be provided.

In the silicon carbide substrate, carbon atoms may be present in the one main surface at not less than 40 at % and not more than 60 at %. Thereby, formation of a high-resistivity layer at the interface between the silicon carbide substrate and the epitaxial growth layer formed on the silicon carbide substrate is suppressed. In particular, carbon atoms as an impurity are present in the one main surface preferably at not more than 22 at %, more preferably at not more than 14 at %, and further preferably at not more than 8 at %.

In the silicon carbide substrate, a metal impurity may be present in the one main surface at not more than $11000 \times 10^{10}$ atoms/cm$^2$, and further at not more than $4000 \times 10^{10}$ atoms/cm$^2$. Metal atoms such as Ti (titanium), Cr (chromium), Fe (iron), Ni (nickel), Cu (copper), Zn (zinc), Ca (calcium), and K (potassium) cause formation of a high-resistivity layer at the interface described above. Therefore, by reducing a presence ratio thereof to the above range, formation of the high-resistivity layer is suppressed. Further, deterioration in quality of the epitaxial growth layer can be suppressed by reducing the metal impurity.

In the silicon carbide substrate, sodium atoms may be present in the one main surface at not more than $10000 \times 10^{10}$ atoms/cm$^2$. If Na (sodium) atoms are present in a large amount, silicon carbide is oxidized at a faster speed, causing an increase in a film thickness of an oxide film in oxidation treatment, and causing an increase in in-plane distribution of the film thickness. Further, Na atoms deteriorate the quality of the epitaxial growth layer formed on the silicon carbide substrate. Therefore, it is preferable to reduce a presence ratio thereof to the above range.

In the silicon carbide substrate, copper atoms and zinc atoms may be present in the one main surface at a total of not more than $6000 \times 10^{10}$ atoms/cm$^2$. As a result of the study by the inventor of the present invention, it has been found that copper (Cu) and zinc (Zn) each serve as an insulating metal which increases resistance of silicon carbide. An insulating metal present in a surface of a silicon carbide substrate increases on-resistance of a semiconductor device fabricated using the silicon carbide substrate. Further, Cu atoms and Zn atoms deteriorate the quality of the epitaxial growth layer formed on the silicon carbide substrate. Therefore, it is preferable to reduce a presence ratio thereof to the above range.

It is to be noted that a presence ratio of an impurity element in a main surface of a silicon carbide substrate can be measured for example by TXRF (Total Reflection X-Ray Fluorescence), AES (Auger Electron Spectroscopy), XPS (X-ray Photoelectron Spectroscopy), ICP-MS (Inductive Coupled Plasma Mass Spectrometry), or the like. More specifically, presence ratios of S and Cl can be measured by TXRF. Presence ratios of O and C can be evaluated by AES or XPS. Further, a presence ratio of a metal impurity can be evaluated by TXRF or ICP-MS. A presence ratio of Na can be evaluated by ICP-MS. TXRF does not require pretreatment, and can make an evaluation simply. On the other hand, in an evaluation by ICP-MS, firstly, a metal is extracted from a surface of a substrate using acid, and the amount of the extracted metal is evaluated by ICP-MS. That is, the amount of an impurity in the entire surface of the substrate which comes into contact with the acid (solution) can be measured. As the acid, aqua regia, hydrochloric acid, hydrofluoric acid, hydrochloric acid/hydrogen peroxide/water mixture, hydrofluoric acid/hydrogen peroxide/water mixture, hydrofluoric-nitric acid, or the like can be used.

In the measurement by TXRF, AES, and XPS, the presence ratio of an impurity element is measured based on information in a region from the main surface to a depth of about 5 nm. That is, in the present application, a presence ratio of an element in a main surface of a silicon carbide substrate means the presence ratio of the element in a region from the main surface to a depth of about 5 nm. It is to be noted that, since XPS evaluates binding energy, it can separately evaluate carbon constituting silicon carbide and carbon contained in an organic substance and the like adhering to a surface, that is, carbon as an impurity.

In the silicon carbide substrate, the one main surface may have a surface roughness of not more than 0.5 nm when evaluated in RMS (see Japanese Industrial Standards: JIS). Thereby, a good-quality epitaxial growth layer is easily formed on the one main surface, improving yield of semiconductor devices. It is to be noted that the surface roughness of the main surface can be measured for example with an AFM (Atomic Force Microscope), an optical interference-type roughness meter, or the like.

The silicon carbide substrate may have a diameter greater than 110 mm. By suppressing formation of the high-resistivity layer in a process for manufacturing a semiconductor device using such a large-diameter substrate, manufacturing efficiency of the semiconductor device can be improved, and manufacturing cost thereof can be suppressed.

In the silicon carbide substrate, the single-crystal silicon carbide constituting the substrate may have a 4H structure, and the one main surface may have an off angle of not less than 0.1° and not more than 10° relative to a {0001} plane of the single-crystal silicon carbide.

Silicon carbide having a 4H structure, which is hexagonal silicon carbide, can be efficiently grown by being grown in a <0001> direction. In addition, a substrate having a small off angle, specifically, an off angle of not more than 10°, relative to the {0001} plane can be efficiently fabricated from a crystal grown in the <0001> direction. On the other hand, good epitaxial growth is easily performed by providing the one main surface with an off angle of not less than 0.1° relative to the {0001} plane.

In the silicon carbide substrate, the single-crystal silicon carbide constituting the substrate may have a 4H structure, and the one main surface may have an off angle of not less than 0.01° and not more than 6° relative to a (000-1) plane of the single-crystal silicon carbide. By setting an off angle of the one main surface relative to the (000-1) plane, that is, a C (carbon) plane-side plane of the {0001} plane, to not less than 0.01° and not more than 6°, efficient fabrication of the substrate and good epitaxial growth on the surface of the substrate can be both achieved. In addition, by forming the main surface of the substrate as a surface close to the C (carbon) plane with high carrier mobility, improvement in channel mobility and the like are easily achieved when a semiconductor device is fabricated using the substrate.

In the silicon carbide substrate, the single-crystal silicon carbide constituting the substrate may have a 4H structure, and the one main surface may have an off angle of not more than 4° relative to a {03-38} plane of the single-crystal silicon carbide. Thereby, suppression of leakage current, improvement in channel mobility, and the like in a semiconductor device manufactured using the substrate are easily achieved.

Preferably, the one main surface of the silicon carbide substrate has a predetermined off angle, for example, an off angle of not more than 4°, relative to any of a (0001) plane, a (03-38) plane, a (01-12) plane, a (01-11) plane, and backside surfaces thereof, i.e., a (000-1) plane, a (0-33-8) plane, a (0-11-2) plane, a (0-11-1) plane.

The silicon carbide substrate may include a base layer, and a single-crystal silicon carbide layer formed on the base layer. In this case, the one main surface may be a surface of the single-crystal silicon carbide layer on a side opposite to a side facing the base layer.

Thereby, a silicon carbide substrate can be manufactured relatively inexpensively for example by preparing an inexpensive base substrate, specifically, a substrate made of single-crystal silicon carbide having a high defect density, a polycrystalline silicon carbide substrate, or a base substrate made of ceramics, as a base layer, and arranging a substrate made of a good-quality silicon carbide single crystal on the base substrate. In particular, since it is difficult to obtain a large-diameter silicon carbide substrate, an inexpensive, large-diameter silicon carbide substrate can be obtained for example by arranging a plurality of single-crystal silicon carbide substrates which have good quality but are small in size on a base layer, side by side when viewed in plan view, to fabricate a silicon carbide substrate having a plurality of single-crystal silicon carbide layers arranged side by side on a base layer along a main surface of the base layer.

A semiconductor device in accordance with the present invention includes a silicon carbide substrate, an epitaxial growth layer formed on one main surface of the silicon carbide substrate, and an electrode formed on the epitaxial growth layer. The silicon carbide substrate constituting the semiconductor device is the silicon carbide substrate in accordance with the present invention described above.

By using the silicon carbide substrate in accordance with the present invention, a good-quality epitaxial growth layer can be formed on the silicon carbide substrate. As a result, according to the semiconductor device in accordance with the present invention, high yield can be ensured.

The semiconductor device may further include a second electrode formed on the other main surface of the silicon carbide substrate as a main surface on a side opposite to a side facing the epitaxial growth layer.

Thereby, a vertical type semiconductor device in which a current flows in a substrate thickness direction is obtained. In addition, by adopting the silicon carbide substrate in accordance with the present invention as a substrate, formation of a high-resistivity layer at the interface between the silicon carbide substrate and the epitaxial growth layer is suppressed, and thus on-resistance is reduced and yield in manufacturing is improved.

A method for manufacturing a silicon carbide substrate in accordance with the present invention includes the steps of: preparing a crystal of single-crystal silicon carbide; obtaining a substrate by cutting the crystal; planarizing at least one main surface of the substrate; and performing finishing treatment on a planarized surface of the substrate. In the step of performing finishing treatment on the surface of the substrate, presence ratios of sulfur atoms and oxygen atoms in the one main surface are adjusted such that the sulfur atoms are present in the one main surface at not less than $60 \times 10^{10}$ atoms/cm$^2$ and not more than $2000 \times 10^{10}$ atoms/cm$^2$, and the oxygen atoms are present in the one main surface at not less than 3 at % and not more than 30 at %.

In the method for manufacturing the silicon carbide substrate in accordance with the present invention, in the step of performing finishing treatment on the surface of the substrate, the presence ratios of the sulfur atoms and the oxygen atoms in the main surface are adjusted to be within the appropriate ranges described above. As a result, according to the method for manufacturing the silicon carbide substrate in accordance with the present invention, a silicon carbide substrate capable of reducing on-resistance and improving yield of semiconductor devices can be manufactured.

In the method for manufacturing the silicon carbide substrate, in the step of performing finishing treatment on the surface of the substrate, a presence ratio of a metal impurity in the one main surface may be adjusted such that the metal impurity is present in the one main surface at not more than $11000 \times 10^{10}$ atoms/cm$^2$. Thereby, formation of a high-resistivity layer at the interface described above can be suppressed. Further, the quality of the epitaxial growth layer can be improved.

In the method for manufacturing the silicon carbide substrate, in the step of performing finishing treatment on the surface of the substrate, a presence ratio of sodium in the one main surface may be adjusted such that sodium atoms are present in the one main surface at not more than $10000 \times 10^{10}$ atoms/cm$^2$. Thereby, in-plane distribution of a film thickness of an oxide film in oxidation treatment can be suppressed, and deterioration in the quality of the epitaxial growth layer formed on the silicon carbide substrate can be suppressed.

In the method for manufacturing the silicon carbide substrate, in the step of performing finishing treatment on the surface of the substrate, a total presence ratio of copper atoms and zinc atoms in the one main surface may be adjusted such that the copper atoms and the zinc atoms are present in the one main surface at a total of not more than $6000 \times 10^{10}$ atoms/cm$^2$. Thereby, on-resistance of a semiconductor device manufactured using the silicon carbide substrate can be reduced, and the quality of the epitaxial growth layer formed on the substrate can be improved.

A method for manufacturing a semiconductor device in accordance with the present invention includes the steps of: preparing the silicon carbide substrate in accordance with the present invention; forming an epitaxial growth layer on one main surface of the silicon carbide substrate; and forming an electrode on the epitaxial growth layer. In the method for manufacturing the semiconductor device in accordance with the present invention, a semiconductor device is manufactured using the silicon carbide substrate in accordance with the present invention. As a result, according to the method for manufacturing the semiconductor device in accordance with the present invention, formation of a high-resistivity layer at an interface between the silicon carbide substrate and the epitaxial growth layer is suppressed, and thus on-resistance is reduced and yield in manufacturing of semiconductor devices is improved.

As is clear from the above description, according to the silicon carbide substrate, the semiconductor device using the substrate, and the methods for manufacturing them in accordance with the present invention, a silicon carbide substrate capable of reducing on-resistance and improving yield of semiconductor devices, a semiconductor device using the substrate, and methods for manufacturing them can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
FIG. 1 is a schematic cross sectional view showing a structure of a silicon carbide substrate.

Hereinafter, embodiments of the present invention will be described with reference to the drawings. It should be noted that in the below-mentioned drawings, the same or corresponding portions are given the same reference characters and are not described repeatedly. Further, in the present specification, an individual orientation is represented by [ ], a group orientation is represented by < >, an individual plane is represented by ( ) and a group plane is represented by { }. In addition, a negative index is supposed to be crystallographically indicated by putting "-" (bar) above a numeral, but is indicated by putting the negative sign before the numeral in the present specification.

First Embodiment

Firstly, a first embodiment as one embodiment of the present invention will be described. Referring to FIG. 1, a silicon carbide substrate 1 in the present embodiment is entirely made of single-crystal silicon carbide, and in one main surface 1A, sulfur atoms are present at not less than $60 \times 10^{10}$ atoms/cm$^2$ and not more than $2000 \times 10^{10}$ atoms/cm$^2$, and oxygen atoms are present at not less than 3 at % and not more than 30 at %.

Since presence ratios of the sulfur atoms and the oxygen atoms in main surface 1A of silicon carbide substrate 1 are set to not more than $2000 \times 10^{10}$ atoms/cm$^2$ and not more than 30 at %, respectively, even if an epitaxial growth layer is formed on main surface 1A, formation of a high-resistivity layer at an interface between the epitaxial growth layer and silicon carbide substrate 1 is suppressed due to the presence of the sulfur atoms and the oxygen atoms. Further, since a good-quality epitaxial growth layer can be formed on the silicon carbide substrate, yield of semiconductor devices is improved. In addition, since the presence ratios of the sulfur atoms and the oxygen atoms in main surface 1A are set to not less than $60 \times 10^{10}$ atoms/cm$^2$ and not less than 3 at %, respectively, binding between silicon atoms constituting silicon carbide substrate 1 and carbon atoms as an impurity is suppressed, and formation of a high-resistivity layer at the above interface is suppressed. As a result, silicon carbide substrate 1 serves as a silicon carbide substrate capable of reducing on-resistance and improving the yield of semiconductor devices. The presence ratio of the sulfur atoms is preferably set to not less than $60 \times 10^{10}$ atoms/cm$^2$ and not more than $900 \times 10^{10}$ atoms/cm$^2$, and more preferably set to not less than $120 \times 10^{10}$ atoms/cm$^2$ and not more than $500 \times 10^{10}$ atoms/cm$^2$. The presence ratio of the oxygen atoms is preferably set to not less than 3 at % and not more than 22 at %, and more preferably set to not less than 5 at % and not more than 15 at %.

Here, in silicon carbide substrate 1, chlorine atoms are preferably present in main surface 1A at not more than $4000 \times 10^{10}$ atoms/cm$^2$. Thereby, a good-quality epitaxial growth layer can be formed on the silicon carbide substrate. Further, on-resistance can be reduced and the yield of semiconductor devices can be improved. The chlorine atoms are present preferably at not more than $800 \times 10^{10}$ atoms/cm$^2$, and more preferably at not more than $100 \times 10^{10}$ atoms/cm$^2$.

Further, in silicon carbide substrate 1, carbon atoms are preferably present in main surface 1A at not less than 40 at % and not more than 60 at %. Thereby, a good-quality epitaxial growth layer can be formed on main surface 1A of silicon carbide substrate 1. In addition, formation of a high-resistivity layer at the interface between silicon carbide substrate 1 and the epitaxial growth layer formed on the silicon carbide substrate is suppressed.

Furthermore, in silicon carbide substrate 1, a metal impurity is present in main surface 1A, preferably at not more than $11000 \times 10^{10}$ atoms/cm$^2$, and further preferably at not more than $4000 \times 10^{10}$ atoms/cm$^2$. Thereby, a good-quality epitaxial growth layer can be formed on main surface 1A of silicon carbide substrate 1. In addition, formation of the high-resistivity layer described above is further suppressed. The metal impurity is present more preferably at not more than $100 \times 10^{10}$ atoms/cm$^2$, and further preferably at not more than $10 \times 10^{10}$ atoms/cm$^2$.

Further, in silicon carbide substrate 1, sodium atoms are present in main surface 1A, preferably at not more than $10000 \times 10^{10}$ atoms/cm$^2$, and more preferably at not more than $1000 \times 10^{10}$ atoms/cm$^2$. Thereby, in-plane distribution of a film thickness of an oxide film in oxidation treatment can be suppressed, and deterioration in the quality of the epitaxial growth layer formed on main surface 1A of silicon carbide substrate 1 can be suppressed. It is further preferable that the sodium atoms are present in main surface 1A at not more than $100 \times 10^{10}$ atoms/cm$^2$, further at not more than $10 \times 10^{10}$ atoms/cm$^2$.

Furthermore, in silicon carbide substrate 1, copper atoms and zinc atoms are present in main surface 1A, preferably at a total of not more than $6000 \times 10^{10}$ atoms/cm$^2$, and more preferably at a total of not more than $1000 \times 10^{10}$ atoms/cm$^2$. Thereby, on-resistance of a semiconductor device manufactured using silicon carbide substrate 1 can be reduced, and the quality of the epitaxial growth layer formed on main surface 1A of silicon carbide substrate 1 can be improved. It is further preferable that the copper atoms and the zinc atoms are present in main surface 1A at a total of not more than $100 \times 10^{10}$ atoms/cm$^2$, further at a total of not more than $10 \times 10^{10}$ atoms/cm$^2$.

Further, in silicon carbide substrate 1, main surface 1A preferably has a surface roughness of not more than 0.5 nm when evaluated in RMS, and more preferably has a surface roughness of not more than 0.3 nm, further not more than 0.1 nm. Thereby, a good-quality epitaxial growth layer can be easily formed on main surface 1A, and the yield of semiconductor devices is improved.

Furthermore, silicon carbide substrate 1 preferably has a diameter greater than 110 mm. Thereby, manufacturing efficiency of the semiconductor device can be improved. More preferably, the diameter is not less than 125 mm and not more than 300 mm. The diameter of not less than 125 mm allows the manufacturing efficiency to be further improved. The diameter of not more than 300 mm facilitates control of warpage and TTV, and allows the yield of semiconductor devices to be improved.

Further, in silicon carbide substrate 1, the single-crystal silicon carbide constituting silicon carbide substrate 1 may have a 4H structure, and main surface 1A may have an off angle of not less than 0.1° and not more than 10° relative to a {0001} plane of the single-crystal silicon carbide. This facilitates forming a good epitaxial growth layer on main surface 1A while improving manufacturing efficiency of the substrate.

On the other hand, in silicon carbide substrate 1, the single-crystal silicon carbide constituting silicon carbide substrate 1 may have a 4H structure, and the one main surface may have an off angle of not more than 4° relative to a {03-38} plane of the single-crystal silicon carbide. This facilitates achieving suppression of leakage current, improvement in channel mobility, and the like in the semiconductor device manufactured using silicon carbide substrate 1.

Figure 2:
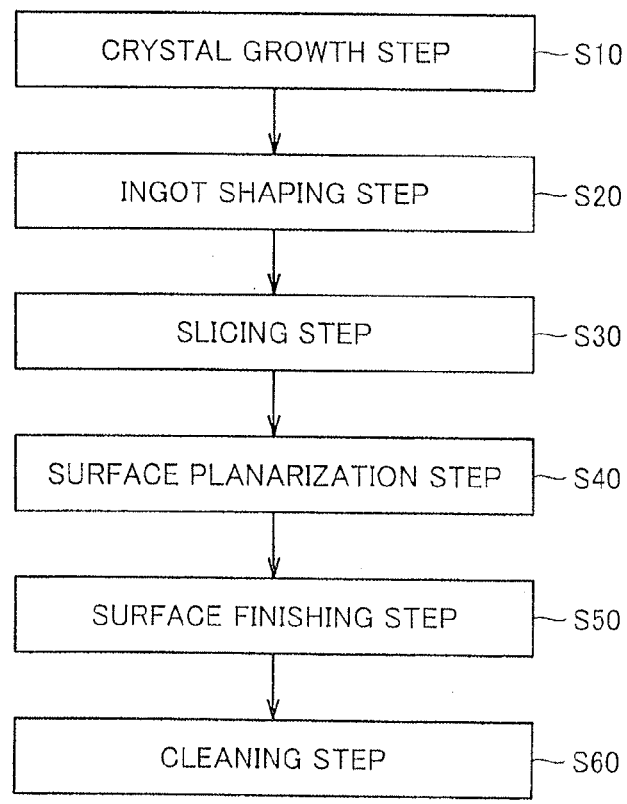
FIG. 2 is a flowchart schematically showing a method for manufacturing the silicon carbide substrate.

Next, a method for manufacturing silicon carbide substrate 1 will be described. Here, chemical durability and a surface state differ depending on the material constituting a substrate. Accordingly, a state of oxidation of a surface of a substrate and ease of adsorption or adhesion of an impurity to the surface differ depending on the material constituting the substrate. Therefore, even if a method for manufacturing a substrate made of another material is applied to a silicon carbide substrate, it is difficult to obtain a silicon carbide substrate having a stabilized surface. For the silicon carbide substrate, a substrate having a stabilized surface can be obtained, for example, by a procedure described below. Referring to FIG. 2, in the method for manufacturing silicon carbide substrate 1 in the present embodiment, firstly, a crystal growth step is performed as a step (S10). In this step (S10), a single-crystal silicon carbide is fabricated, for example, by a sublimation method described below.

Firstly, a seed crystal made of single-crystal silicon carbide and source material powder made of silicon carbide are inserted into a container made of graphite. Subsequently, the source material powder is heated, and thereby silicon carbide is sublimated and recrystallized on the seed crystal. On this occasion, recrystallization proceeds while a desired impurity such as nitrogen is being introduced. Then, heating is stopped when a crystal of a desired size is grown on the seed crystal, and a crystal of single-crystal silicon carbide is taken out from the container.

Figure 3:
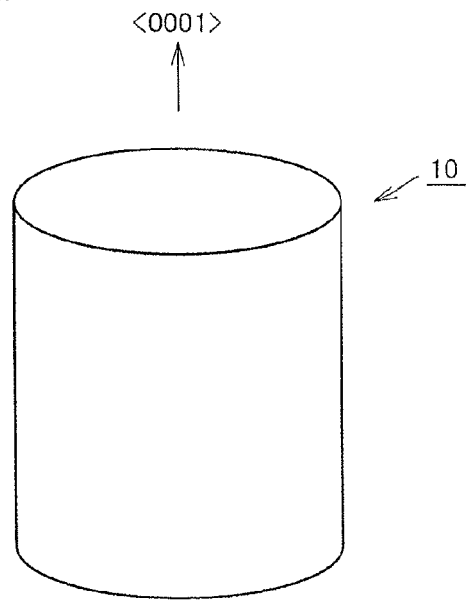
FIG. 3 is a schematic perspective view for illustrating the method for manufacturing the silicon carbide substrate.

Next, an ingot shaping step is performed as a step (S20). In this step (S20), the crystal of single-crystal silicon carbide fabricated in step (S10) is processed into an ingot 10 having, for example, a cylindrical shape shown in FIG. 3. On this occasion, since growing hexagonal silicon carbide in the <0001> direction can efficiently promote crystal growth while suppressing occurrence of a defect, it is preferable to fabricate ingot 10 having a longitudinal direction corresponding to the <0001> direction as shown in FIG. 3.

Figure 4:
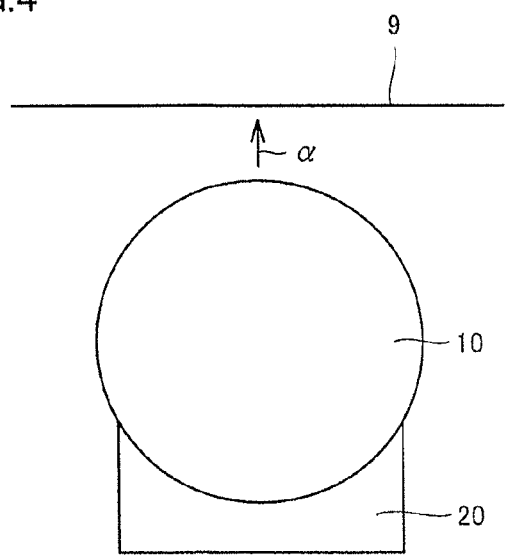
FIG. 4 is a schematic plan view for illustrating the method for manufacturing the silicon carbide substrate.
Figure 5:
FIG. 5 is a schematic perspective view for illustrating the method for manufacturing the silicon carbide substrate.

Next, a slicing step is performed as a step (S30). In this step (S30), a substrate is fabricated by cutting ingot 10 obtained in step (S20). Specifically, referring to FIG. 4, firstly, fabricated columnar (cylindrical) ingot 10 is set such that a portion of its side surface is supported by a support 20. Subsequently, while a wire 9 is running in a direction along a direction of a diameter of ingot 10, ingot 10 approaches wire 9 along a cutting direction α perpendicular to the running direction, and thus ingot 10 comes into contact with wire 9. Then, ingot 10 keeps moving along cutting direction α, and thereby ingot 10 is cut. Thus, silicon carbide substrate 1 shown in FIG. 5 is obtained. On this occasion, ingot 10 is cut such that main surface 1A of silicon carbide substrate 1 has a desired plane orientation.

Next, a surface planarization step is performed as a step (S40). In this step (S40), grinding processing, polishing processing, and the like are performed on main surface 1A of silicon carbide substrate 1 to reduce roughness of a cut surface formed in step (S30) (i.e., main surface 1A). In the grinding processing, a diamond grindstone is used as a tool, and the grindstone is set to face silicon carbide substrate 1 and rotated to cut into it at a constant speed, and thereby removes a surface of the substrate. Main surface 1A can be planarized by removing its unevenness, and its thickness can be adjusted. In the polishing processing, a desired surface roughness can be obtained by adjusting a grain size of abrasive grains such as diamond. As a surface plate, a surface plate made of a metal such as iron, copper, tin, a tin alloy, or the like, a composite surface plate made of a metal and a resin, or a polishing cloth can be used. Using a hard metal surface plate can improve a rate. Using a polishing cloth can reduce the surface roughness. In order to set the surface roughness within an appropriate range, it is preferable to set a resistance coefficient R ($m^2/s$), which is represented by R=η×Q×V/S×P using a viscosity η (mPa·s) of a polishing liquid, a liquid flow rate Q ($m^3/s$), an area S ($m^2$) of the polishing surface plate, a polishing pressure P (kPa), and a peripheral speed V (m/s), to $1.0\times10^{-18}$ to $3.0\times10^{-17}$. By controlling resistance coefficient R, a resistance applied to the substrate during polishing by friction between the surface plate and the substrate can be uniformized all over the substrate and set within a range appropriate for planarization processing, and in-plane distribution of the roughness can be reduced.

Next, a surface finishing step is performed as a step (S50). In this step (S50), by performing dry etching, CMP (Chemical Mechanical Polishing), or the like on main surface 1A of silicon carbide substrate 1, main surface 1A is finished to an extent that a good-quality epitaxial growth layer can be formed on main surface 1A, for example, to an extent that main surface 1A has a surface roughness of not more than 0.5 nm when evaluated in RMS.

On this occasion, for example, by using a sulfur-based gas, a chlorine-based gas, and an oxygen-based gas in the dry etching, presence ratios of sulfur atoms, chlorine atoms, and oxygen atoms in main surface 1A are each increased. Thus, by appropriately selectively using these gases, the presence ratios of the sulfur atoms, the chlorine atoms, and the oxygen atoms in main surface 1A can each be adjusted to be within the desired range described above. Further, by appropriately selectively using composition of a polishing agent for the CMP and conditions therefor, the presence ratios of the sulfur atoms, the chlorine atoms, and the oxygen atoms in main surface 1A can each be adjusted to be within the desired range described above. In order to improve polishing speed and reduce surface roughness, it is effective to increase a chemical action of the polishing liquid for the CMP. Specifically, the polishing liquid preferably has a pH of not more than 4 or not less than 9.5, and more preferably has a pH of not more than 2 or not less than 10.5. Further, an oxidant is preferably added to the polishing liquid. As the oxidant, a chlorine-based oxidant such as trichloroisocyanuric acid, dichloroisocyanurate, or the like, sulfuric acid, nitric acid, aqueous hydrogen peroxide, or the like can be used. Sulfuric acid or sulfate is preferably used for pH adjustment, because it facilitates control of the presence ratio of the sulfur atoms in main surface 1A. Aqueous hydrogen peroxide is preferably adopted as the oxidant, because it facilitates control of the presence ratio of the oxygen atoms in main surface 1A. In order to control a presence ratio of atoms in the surface (impurity atoms), control the surface roughness, and improve the polishing speed, it is preferable to satisfy the following equation:

$$-50x+700 \leq y \leq -50x+1000,$$

where x represents a pH of the polishing liquid, and y represents an oxidation-reduction potential.

By controlling the oxidation-reduction potential within an appropriate range, it is possible to control oxidation power of the polishing liquid, control the amount of oxygen in the surface, and control the surface roughness and the polishing speed within appropriate ranges.

Further, in order to control composition of the surface, control the surface roughness, and improve the polishing speed, it is preferable to set resistance coefficient R ($m^2$/s), which is represented by R=η×Q×V/S×P using viscosity η (mPa·s) of the polishing liquid, liquid flow rate Q ($m^3$/s), area S ($m^2$) of the polishing surface plate, polishing pressure P (kPa), and peripheral speed V (m/s), to $1.0 \times 10^{-15}$ to $3.0 \times 10^{-14}$. By controlling the resistance coefficient, a resistance applied to the substrate during polishing by friction between the polishing cloth and the substrate with the polishing agent interposed therebetween can be controlled, the composition of the surface can be effectively controlled, and the surface roughness and the polishing speed can be controlled within appropriate ranges. Abrasive grains of the polishing agent for the CMP are required to be made of a material softer than silicon carbide in order to reduce the surface roughness and a process-damaged layer, and specifically, it is preferable to adopt colloidal silica, fumed silica, or the like.

Next, a cleaning step is performed as a step (S60). In this step (S60), foreign matter adhering to the surface during the process up to step (S50) is removed by cleaning. The presence ratios of the carbon atoms and the metal impurity can each be adjusted to be within the desired range described above, through selection of a chemical solution, application of ultrasound, overflow circulation of the chemical solution in a cleaning tank, and removal of particles using a filter in the cleaning step. As the chemical solution, inorganic acid, inorganic alkali, organic acid, or organic alkali can be used. Further, aqueous hydrogen peroxide can be used as an oxidant for the purpose of improving the ability to remove the metal impurity by cleaning. The ultrasound can have a frequency of 50 kHz to 2 MHz. The filter for circulating the chemical solution preferably has a pore diameter of not less than 50 nm and not more than 5 μm. Through the above steps, silicon carbide substrate 1 in the present embodiment is completed.

Figure 6:
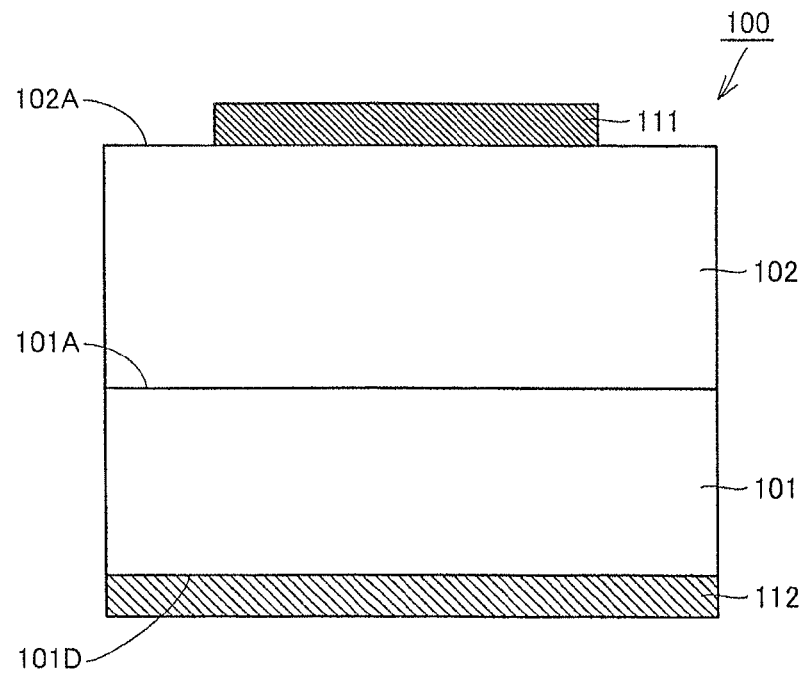
FIG. 6 is a schematic cross sectional view showing a structure of a Schottky barrier diode.

Next, a semiconductor device in the present embodiment will be described. Referring to FIG. 6, a Schottky barrier diode 100 serving as a semiconductor device in the present embodiment includes a silicon carbide substrate 101, a drift layer 102 formed on one main surface 101A of silicon carbide substrate 101 and serving as an epitaxial growth layer made of single-crystal silicon carbide, an anode electrode 111 as a first electrode formed on and in contact with a main surface 102A of drift layer 102 on a side opposite to a side facing silicon carbide substrate 101, and a cathode electrode 112 as a second electrode formed on the other main surface 101D of silicon carbide substrate 101 as a main surface on a side opposite to a side facing drift layer 102.

Silicon carbide substrate 101 has n type conductivity (a first conductivity type) because it contains an n type impurity (an impurity supplying electrons as a carrier) such as nitrogen. Drift layer 102 has n type conductivity because it contains an n type impurity having a concentration lower than that in silicon carbide substrate 101. Anode electrode 111 is made of a metal which can make Schottky contact with drift layer 102. Cathode electrode 112 is made of a metal which can make ohmic contact with silicon carbide substrate 101.

When a voltage is applied to Schottky barrier diode 100 in a forward direction, a current flows between anode electrode 111 and cathode electrode 112 via silicon carbide substrate 101 and drift layer 102. On the other hand, when a voltage is applied in a reverse direction, a depletion layer is formed in drift layer 102 to include a region in contact with anode electrode 111, and thus no current flows.

In the present embodiment, silicon carbide substrate 1 in the present embodiment described above is adopted as silicon carbide substrate 101. On this occasion, main surface 1A of silicon carbide substrate 1 corresponds to main surface 101A of silicon carbide substrate 101. As described above, in silicon carbide substrate 1, the presence ratios of the sulfur atoms and the oxygen atoms in main surface 1A are each adjusted to be within an appropriate range. Thus, formation of a high-resistivity layer at an interface between drift layer 102 serving as the epitaxial growth layer and silicon carbide substrate 101 of Schottky barrier diode 100 is suppressed. As a result, Schottky barrier diode 100 serves as a semiconductor device with reduced on-resistance and improved yield.

Figure 7:
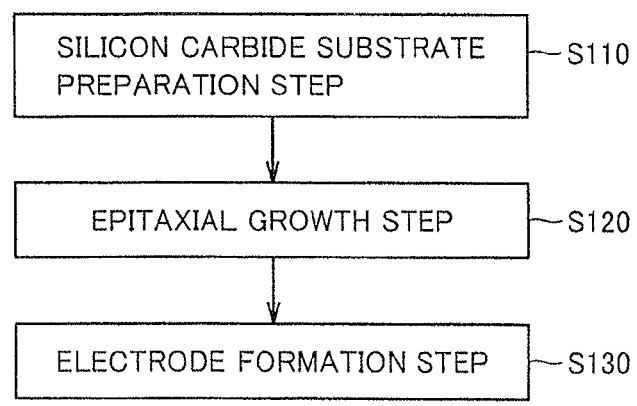
FIG. 7 is a flowchart schematically showing a method for manufacturing the Schottky barrier diode.

Next, one example of a method for manufacturing Schottky barrier diode 100 will be described. Referring to FIG. 7, in the method for manufacturing Schottky barrier diode 100 in the present embodiment, firstly, a silicon carbide substrate preparation step is performed as a step (S110). In this step (S110), silicon carbide substrate 1 is fabricated by the method for manufacturing the silicon carbide substrate in the present embodiment described above. Then, referring to FIG. 6, silicon carbide substrate 1 is used as silicon carbide substrate 101.

Next, an epitaxial growth step is performed as a step (S120). In this step (S120), drift layer 102 is formed on main surface 101A of silicon carbide substrate 101 by epitaxial growth. On this occasion, in silicon carbide substrate 101, the presence ratios of the sulfur atoms and the oxygen atoms in main surface 101A are each adjusted to be within an appropriate range. Thus, formation of a high-resistivity layer at the interface between drift layer 102 and silicon carbide substrate 101 is suppressed. Further, deterioration in the quality of the epitaxial growth layer (drift layer 102) can be suppressed.

Next, an electrode formation step is performed as a step (S130). In this step (S130), anode electrode 111 arranged on and in contact with main surface 102A of drift layer 102, and cathode electrode 112 arranged on and in contact with main surface 101D of silicon carbide substrate 101 are formed.

Formation of the electrodes can be performed, for example, by combining evaporation of a metal film, formation of a mask layer, and shaping of the metal film by etching. In order to adjust the thickness of silicon carbide substrate 101, processing such as backside surface grinding and polishing may be performed on silicon carbide substrate 101, from a main surface 101D side of silicon carbide substrate 101, before forming cathode electrode 112 to reduce the thickness of silicon carbide substrate 101. Through the process described above, Schottky barrier diode 100 in the present embodiment can be manufactured.

Figure 8:
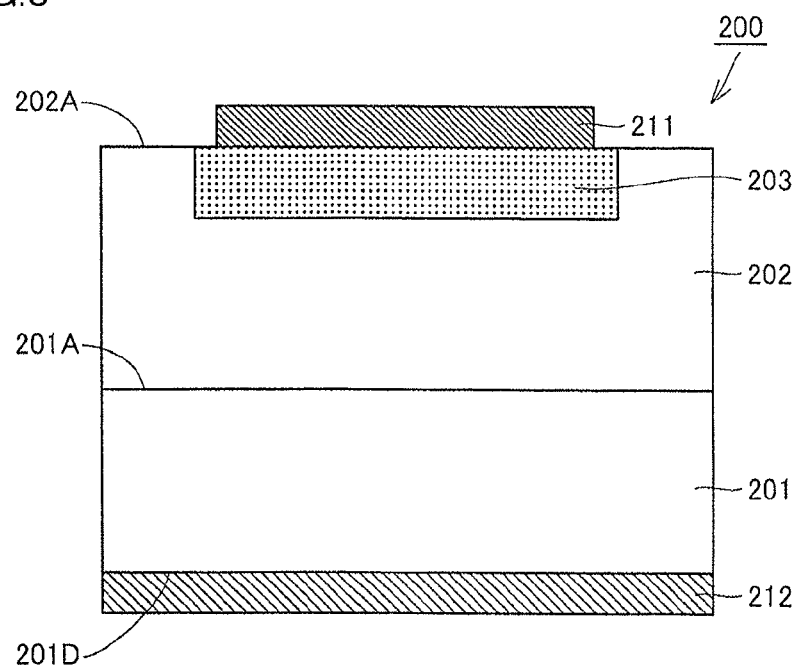
FIG. 8 is a schematic cross sectional view showing a structure of a Pin diode.

Next, a modification of the semiconductor device in the present embodiment will be described. Referring to FIG. 8, a Pin (positive-intrinsic-negative) diode 200 serving as a semiconductor device in the modification of the present embodiment includes a silicon carbide substrate 201 having n type conductivity (the first conductivity type), a drift layer 202 formed on one main surface 201A of silicon carbide substrate 201 and serving as an epitaxial growth layer having n type conductivity made of single-crystal silicon carbide, a p region 203 having p type conductivity (the second conductivity type) formed to include a main surface 202A of drift layer 202 on a side opposite to a side facing silicon carbide substrate 201, an anode electrode 211 as a first electrode formed on and in contact with p region 203, and a cathode electrode 212 as a second electrode formed on the other main surface 201D of silicon carbide substrate 201 as a main surface on a side opposite to a side facing drift layer 202. Silicon carbide substrate 201, drift layer 202, anode electrode 211, and cathode electrode 212 correspond to silicon carbide substrate 101, drift layer 102, anode electrode 111, and cathode electrode 112 of Schottky barrier diode 100, respectively, and basically have identical structures. However, Pin diode 200 in the present modification is different from Schottky barrier diode 100 in that p region 203 is formed within drift layer 202 and p region 203 makes ohmic contact with anode electrode 211.

Specifically, p region 203 has p type conductivity because it contains a p type impurity (an impurity supplying holes as a carrier) such as boron. Further, anode electrode 211 is made of a metal which can make ohmic contact with p region 203.

When a voltage is applied to Pin diode 200 in the forward direction, a current flows between anode electrode 211 and cathode electrode 212 via silicon carbide substrate 201, drift layer 202, and p region 203. On the other hand, when a voltage is applied in the reverse direction, a depletion layer is formed in a region including an interface between p region 203 and drift layer 202 other than p region 203, and thus no current flows.

Also in the present modification, silicon carbide substrate 1 in the present embodiment described above is adopted as silicon carbide substrate 201. On this occasion, main surface 1A of silicon carbide substrate 1 corresponds to main surface 201A of silicon carbide substrate 201. As a result, Pin diode 200 serves as a semiconductor device with reduced on-resistance and improved yield, as with Schottky barrier diode 100.

Figure 9:
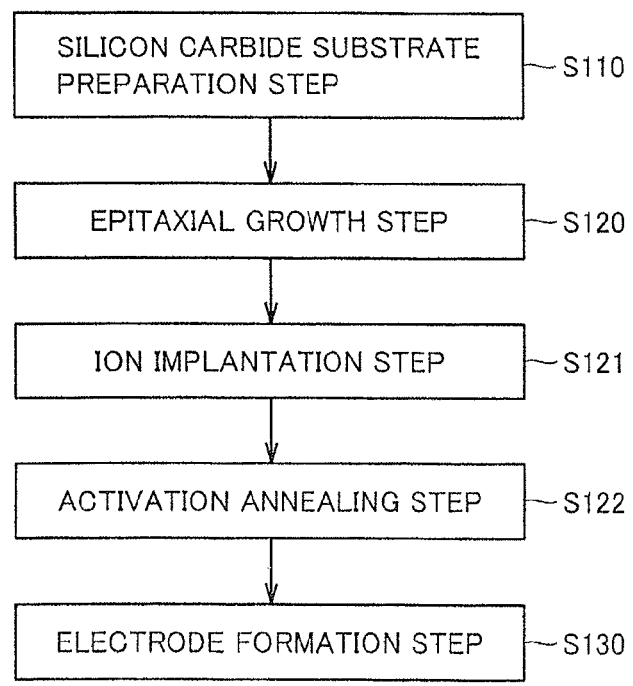
FIG. 9 is a flowchart schematically showing a method for manufacturing the Pin diode.

Next, one example of a method for manufacturing Pin diode 200 will be described. Referring to FIG. 9, in the method for manufacturing Pin diode 200 in the modification of the present embodiment, firstly, the silicon carbide substrate preparation step as step (S110) and the epitaxial growth step as step (S120) are performed as with Schottky barrier diode 100, and thereby a structural body having drift layer 202 formed on silicon carbide substrate 201 is obtained (see FIG. 8). On this occasion, formation of a high-resistivity layer at an interface between silicon carbide substrate 201 and drift layer 202 is suppressed by using silicon carbide substrate 1 as silicon carbide substrate 201, as with Schottky barrier diode 100. Further, deterioration in the quality of the epitaxial growth layer (drift layer 202) can be suppressed.

Next, referring to FIG. 9, an ion implantation step is performed as a step (S121). In this step (S121), referring to FIG. 8, p region 203 is formed by performing ion implantation on drift layer 202 formed in step (S120). The ion implantation can be performed, for example, by forming a mask layer made of silicon dioxide over main surface 202A of drift layer 202 by photolithography and RIE (Reactive Ion Etching), and using the mask layer as a mask.

Next, an activation annealing step is performed as a step (S122). In this step (S122), for example, heat treatment of heating the structural body to about 1600° C. to 1900° C. is performed. Thereby, the impurity such as boron implanted in step (S121) is activated, and thus the p region has p type conductivity. Thereafter, step (S130) is performed as with Schottky barrier diode 100, and Pin diode 200 in the present modification is completed.

Second Embodiment

Figure 10:
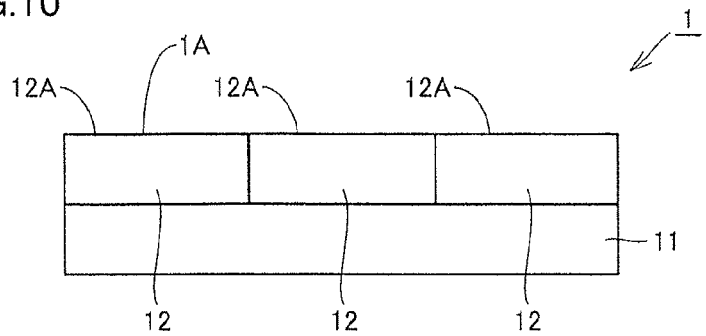
FIG. 10 is a schematic cross sectional view showing a structure of a silicon carbide substrate in a second embodiment.

Next, a silicon carbide substrate in a second embodiment will be described. Referring to FIG. 10, silicon carbide substrate 1 in the second embodiment basically has the same structure and exhibits the same effect as those of silicon carbide substrate 1 in the first embodiment. However, silicon carbide substrate 1 in the second embodiment is different from that in the first embodiment in that it includes a base layer and a single-crystal silicon carbide layer.

Specifically, referring to FIG. 10, silicon carbide substrate 1 in the second embodiment includes a base layer 11, and a single-crystal silicon carbide layer 12 formed on base layer 11. Further, a main surface 12A of single-crystal silicon carbide layer 12 on a side opposite to a side facing base layer 11 corresponds to main surface 1A in the first embodiment. That is, in silicon carbide substrate 1 in the present embodiment, a region including one main surface 12A is made of single-crystal silicon carbide.

In silicon carbide substrate 1 in the present embodiment, an inexpensive base substrate, for example, a substrate made of single-crystal silicon carbide having a high defect density, a polycrystalline silicon carbide substrate, or a base substrate made of ceramics, is adopted as base layer 11, and a substrate made of a good-quality silicon carbide single crystal is arranged on base layer 11 to serve as single-crystal silicon carbide layer 12. Thus, silicon carbide substrate 1 in the present embodiment serves as a silicon carbide substrate with suppressed manufacturing cost. Further, in the present embodiment, silicon carbide substrate 1 has a structure in which a plurality of single-crystal silicon carbide layers 12 are arranged on base layer 11 with a large diameter, side by side when viewed in plan view. As a result, silicon carbide substrate 1 in the present embodiment serves as a silicon carbide substrate with suppressed manufacturing cost and with a large diameter.

Figure 11:
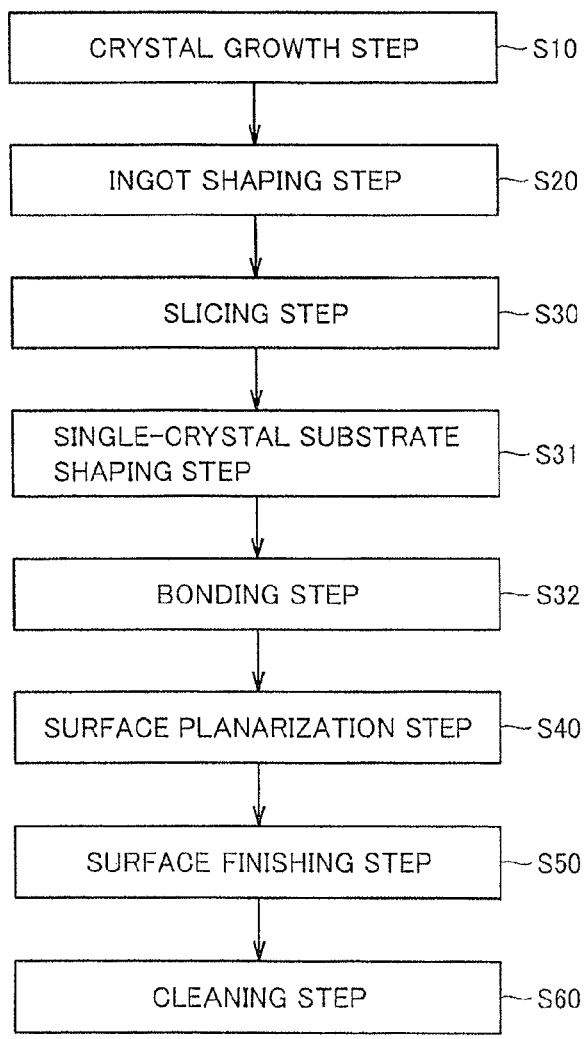
FIG. 11 is a flowchart schematically showing a method for manufacturing the silicon carbide substrate in the second embodiment.

Next, a method for manufacturing the silicon carbide substrate in the present embodiment will be described. Referring to FIG. 11, in the method for manufacturing the silicon carbide substrate in the present embodiment, firstly, steps (S10) to (S30) are performed as in the first embodiment. Thereafter, a single-crystal substrate shaping step is performed as a step (S31). In this step (S31), a substrate obtained as a result of steps (S10) to (S30) is shaped into a shape suitable to constitute single-crystal silicon carbide layer 12 shown in FIG. 10. Specifically, a plurality of rectangular substrates are prepared by shaping the substrate obtained as a result of steps (S10) to (S30).

Next, a bonding step is performed as a step (S32). In this step (S32), the plurality of substrates fabricated in step (S31) are arranged on a separately prepared base substrate, side by side when viewed in plan view, for example, in a matrix state. Thereafter, the substrates fabricated in step (S31) are integrated with the base substrate by being subjected to treatment of heating them to a predetermined temperature, and a structural body in which the plurality of single-crystal silicon carbide layers 12 are arranged on base layer 11, side by side when viewed in plan view, is obtained, as shown in FIG. 10.

Thereafter, steps (S40) to (S60) are performed as in the above embodiment, and thereby the silicon carbide substrate in the second embodiment is completed.

It is to be noted that, although the second embodiment has described the case where silicon carbide substrate 1 is formed by directly bonding base layer 11 and single-crystal silicon carbide layer 12 by heating, they may be bonded via an intermediate layer interposed therebetween. Further, although the above embodiment has described a diode as an exemplary semiconductor device, the semiconductor device in accordance with the present invention is not limited thereto, and may be, for example, a MOSFET (Metal Oxide Semiconductor Field Effect Transistor), an IGBT (Insulated Gate Bipolar Transistor), a JFET (Junction Field Effect Transistor), or the like.

EXAMPLES

Example 1

An experiment was conducted to investigate the influence of presence ratios of sulfur atoms and oxygen atoms in a main surface of a silicon carbide substrate on yield of devices. Specifically, 11 substrates having different presence ratios of sulfur atoms and oxygen atoms in main surfaces thereof were prepared, and a plurality of semiconductor devices were fabricated for each substrate. Then, operation of the fabricated devices was checked to investigate yield thereof. A silicon carbide single crystal was grown by the sublimation method. As a seed substrate, a silicon carbide substrate with a diameter of 50 mm having a main surface corresponding to a (0001) plane was used. The grown crystal had a nitrogen concentration of $1 \times 10^{19}$ cm$^{-3}$. A grown surface, a seed substrate surface, and an outer periphery of the crystal were ground with an outer periphery grinding machine to obtain a cylindrical ingot of silicon carbide. Slicing was performed using a multiwire saw. In order to obtain a sliced main surface corresponding to the {03-38} plane, the ingot was set in a wire saw apparatus with being tilted by 54.7° from a running direction of a wire, and was cut. A sliced substrate had a thickness of 250 µm. The sliced substrate was diced to obtain a tile substrate of 20 mm×30 mm. Crystal growth for a base substrate was performed in a carbon container by the sublimation method, without using a seed crystal, to grow polycrystalline silicon carbide. An ingot with a diameter of 155 mm was obtained by outer periphery processing. The ingot was sliced with a multiwire saw to obtain a polycrystalline base substrate with a thickness of 500 µm. The rectangular single-crystal substrates were arranged on the polycrystalline base substrate, and bonded by close-spaced sublimation. The outer periphery of the bonded composite substrate was processed to obtain a substrate with a diameter of 150 mm and a thickness of 750 µm.

The base substrate and the single-crystal substrates of the composite substrate were sequentially flattened to obtain a substrate for epitaxial growth. The base substrate was subjected to grinding processing using a diamond grindstone, and thereafter subjected to polishing processing, and thereby its main surface was mirror finished to have a Ra of 0.3 to 10 nm. An in-feed type grinder was used for the grinding processing, and a vitrified bonded grindstone having a mesh size of #600 and a concentration degree of 150 was used as the grindstone. In the polishing processing, multistage lapping was performed. A copper surface plate and a tin surface plate were used as surface plates, and diamond slurry with a grain size of 3 µm and diamond slurry with a grain size of 1 µm were used.

In order to process a single crystal surface, grinding processing, lapping processing, and thereafter CMP were performed. Colloidal silica with an average grain size of 50 nm was used as abrasive grains of slurry for the CMP. In order to improve a rate and control composition of a surface, sulfuric acid and aqueous hydrogen peroxide were added as chemical components of the slurry. Adjustment was made to satisfy the following equation:

$$-50x+700 \leq y \leq -50x+1000,$$

where x represents a pH of the slurry, and y represents an oxidation-reduction potential.

A suede-type polishing cloth was adopted. Further, resistance coefficient R (m$^2$/s), which is represented by R=η× Q×V/S×P using viscosity η (mPa·s) of a polishing liquid, liquid flow rate Q (m$^3$/s), area S (m$^2$) of the polishing surface plate, polishing pressure P (kPa), and peripheral speed V (m/s), was set to 1.0 to $1.5 \times 10^{-14}$. The presence ratio of the sulfur atoms was analyzed by TXRF, and the presence ratio of the oxygen atoms was analyzed by XPS. Table 1 shows results of the experiment.

A Schottky barrier diode was adopted as the device. The thickness of the substrate was adjusted to 150 µm by performing backside surface grinding before forming a cathode electrode. A good epitaxial growth layer was able to be formed by controlling the composition of the surface, and good device characteristics were obtained by suppressing an increase in resistance at an interface between the substrate and the epitaxial growth layer.

TABLE 1

| | 1 | 2 | 3 | 4 | 5 | 6 | 7 | 8 | 9 | 10 | 11 |
|---|---|---|---|---|---|---|---|---|---|---|---|
| S presence ratio ($\times 10^{10}$ atoms/cm$^2$) | 40 | 60 | 40 | 60 | 120 | 500 | 900 | 2000 | 2000 | 3000 | 3000 |
| O presence ratio (at %) | 2 | 2 | 3 | 3 | 5 | 15 | 22 | 30 | 35 | 30 | 35 |
| Device yield (%) | 39 | 44 | 45 | 60 | 68 | 71 | 62 | 55 | 37 | 35 | 28 |

As shown in Table 1, yield exceeding 50% was achieved in samples 4 to 8 in which sulfur atoms were present in the substrate main surface at not less than $60 \times 10^{10}$ atoms/cm$^2$ and not more than $2000 \times 10^{10}$ atoms/cm$^2$, and oxygen atoms were present in the substrate main surface at not less than 3 at % and not more than 30 at %. Thus, it was confirmed that, according to the silicon carbide substrate in accordance with the present invention in which sulfur atoms are present in the substrate main surface in the range of not less than $60 \times 10^{10}$ atoms/cm$^2$ and not more than $2000 \times 10^{10}$ atoms/cm$^2$, and oxygen atoms are present in the substrate main surface in the range of not less than 3 at % and not more than 30 at %, yield of semiconductor devices can be improved.

Example 2

A composite substrate was fabricated as in Example 1, except that the tile substrate had a main surface with a plane orientation of {0001} and the colloidal silica had a grain size of 90 nm. The plane orientation of the tile substrate was controlled by a cutting direction during slicing. A sliced substrate had a thickness of 250 µm. It was confirmed also in the composite substrate with a plane orientation of {0001} that, according to the silicon carbide substrate in accordance with the present invention in which sulfur atoms are present in the substrate main surface in the range of not less than $60 \times 10^{10}$ atoms/cm$^2$ and not more than $2000 \times 10^{10}$ atoms/cm$^2$, and oxygen atoms are present in the substrate main surface in the range of not less than 3 at % and not more than 30 at %, yield of semiconductor devices can be improved.

Example 3

An experiment was conducted to investigate the influence of a presence ratio of chlorine atoms in a main surface of a silicon carbide substrate on yield of devices. Specifically, four substrates having different presence ratios of chlorine atoms in main surfaces thereof were prepared, and a plurality of devices were fabricated for each substrate as in Example 1. Then, operation of the fabricated devices was checked to investigate yield thereof. Using the composite substrate in Example 1, composition of a surface was controlled by changing conditions for the CMP. In order to improve the rate and control the composition of the surface, sodium sulfate and sodium dichloroisocyanurate were added as chemical components of slurry. Colloidal silica with an average grain size of 50 nm was used as abrasive grains of the slurry for the CMP. A suede-type polishing cloth was used. Further, resistance coefficient R (m$^2$/s) was set to 2.0 to $5.0 \times 10^{-15}$ (m$^2$/s). The presence ratio of the chlorine atoms was analyzed by TXRF. Table 2 shows results of the experiment.

TABLE 2

|  | 1 | 2 | 3 | 4 |
|---|---|---|---|---|
| S presence ratio ($\times 10^{10}$ atoms/cm$^2$) | 1000 | 1000 | 1000 | 1000 |
| O presence ratio (at %) | 24 | 24 | 24 | 24 |
| Cl presence ratio ($\times 10^{10}$ atoms/cm$^2$) | 100 | 800 | 4000 | 5000 |
| Device yield (%) | 68 | 66 | 63 | 58 |

As shown in Table 2, yield exceeding 50% was achieved in samples 1 to 3 in which chlorine atoms were present in the substrate main surface at not more than $4000 \times 10^{10}$ atoms/cm$^2$. Thus, it can be said that chlorine atoms are preferably present in the substrate main surface at not more than $4000 \times 10^{10}$ atoms/cm$^2$. In addition, in order to further improve the yield, it is can be said that chlorine atoms are present in the substrate main surface preferably at not more than $800 \times 10^{10}$ atoms/cm$^2$, and more preferably at not more than $100 \times 10^{10}$ atoms/cm$^2$.

Example 4

An experiment was conducted to investigate the influence of a surface roughness in a main surface of a silicon carbide substrate on yield of devices. Specifically, five substrates having different surface roughnesses in main surfaces thereof were prepared, and a plurality of devices were fabricated for each substrate as in Example 1. Then, operation of the fabricated devices was checked to investigate yield thereof. Using the composite substrate in Example 1, surface roughness was controlled by changing conditions for the CMP. Colloidal silica with an average grain size of 20 to 100 nm was used as abrasive grains of slurry for the CMP. A suede-type polishing cloth was used. Further, resistance coefficient R (m$^2$/s) was set to 2.0 to $5.0 \times 10^{-15}$ (m$^2$/s). Table 3 shows results of the experiment.

TABLE 3

|  | 1 | 2 | 3 | 4 | 5 |
|---|---|---|---|---|---|
| S presence ratio ($\times 10^{10}$ atoms/cm$^2$) | 800 | 800 | 800 | 800 | 800 |
| O presence ratio (at %) | 16 | 16 | 16 | 16 | 16 |
| Roughness RMS (nm) | 0.1 | 0.2 | 0.3 | 0.5 | 1 |
| Device yield (%) | 72 | 71 | 70 | 68 | 64 |

As shown in Table 3, when the main surface had a surface roughness RMS (see JIS) of not more than 0.5 nm, high yield of not less than 68% was obtained. Thus, it is considered preferable that the substrate main surface has a roughness of not more than 0.5 nm when evaluated in RMS. In addition, from the viewpoint of further improving the yield, it is considered more preferable that the substrate main surface has a roughness of not more than 0.3 nm, further not more than 0.1 nm, when evaluated in RMS.

The same evaluation was also performed on a substrate entirely made of single-crystal silicon carbide. A silicon carbide single crystal was grown by the sublimation method. As a seed substrate, a silicon carbide substrate with a diameter of 100 mm having a main surface corresponding to the (0001) plane was used. The grown crystal had a nitrogen concentration of $6 \times 10^{18}$ cm$^{-3}$. Slicing was performed using a multiwire saw. The slicing was performed to obtain a sliced substrate surface having a plane orientation of {10001}, and a substrate with a diameter of 110 mm was obtained. Backside and frontside surfaces of the sliced substrate were sequentially flattened to obtain a substrate for epitaxial growth. The flattening was performed as that for the composite substrate. In the substrate with the composition of the surface in accordance with the present invention, good yield was obtained. A good epitaxial growth layer was able to be formed by controlling the composition of the surface, and good semiconductor device characteristics were obtained by suppressing an increase in resistance at an interface between the substrate and the epitaxial growth layer.

Example 5

An experiment was conducted to investigate the influence of a presence ratio of metal atoms in a main surface of a silicon carbide substrate on yield of devices. Specifically, six substrates having different presence ratios of metal atoms in main surfaces thereof were prepared, and a plurality of devices were fabricated for each substrate as in Example 1. Then, operation of the fabricated devices was checked to investigate yield thereof. Using the composite substrate in Example 1, the amount of a metal impurity in a surface was controlled by changing a chemical solution or the like in the cleaning step. Table 4 shows results of the experiment.

TABLE 4

| | 1 | 2 | 3 | 4 | 5 | 6 |
|---|---|---|---|---|---|---|
| S presence ratio ($\times 10^{10}$ atoms/cm$^2$) | 1500 | 1500 | 1500 | 1500 | 1500 | 1500 |
| O presence ratio (at %) | 27 | 27 | 27 | 27 | 27 | 27 |
| Metal impurity ($\times 10^{10}$ atoms/cm$^2$) | 2 | 10 | 100 | 4000 | 11000 | 13000 |
| Device yield (%) | 67 | 66 | 64 | 62 | 61 | 56 |

As shown in Table 4, yield exceeding 60% was achieved in samples 1 to 5 in which metal atoms were present in the substrate main surface at not more than $11000 \times 10^{10}$ atoms/cm$^2$. Thus, it can be said that metal atoms are preferably present in the substrate main surface at not more than $11000 \times 10^{10}$ atoms/cm$^2$. In addition, in order to further improve the yield, it can be said that metal atoms are present in the substrate main surface preferably at not more than $4000 \times 10^{10}$ atoms/cm$^2$, and more preferably at not more than $100 \times 10^{10}$ atoms/cm$^2$, further at not more than $10 \times 10^{10}$ atoms/cm$^2$.

Example 6

An experiment was conducted to investigate the influence of a presence ratio of sodium atoms in a main surface of a silicon carbide substrate on yield of devices. Specifically, six substrates having different presence ratios of sodium atoms in main surfaces thereof were prepared, and a plurality of devices were fabricated for each substrate as in Example 1. Then, operation of the fabricated devices was checked to investigate yield thereof. Using the composite substrate in Example 1, the presence ratio of sodium in a surface was controlled by changing a chemical solution or the like in the cleaning step. Table 5 shows results of the experiment.

TABLE 5

| | 1 | 2 | 3 | 4 | 5 | 6 |
|---|---|---|---|---|---|---|
| S presence ratio ($\times 10^{10}$ atoms/cm$^2$) | 1200 | 1200 | 1200 | 1200 | 1200 | 1200 |
| O presence ratio (at %) | 21 | 21 | 21 | 21 | 21 | 21 |
| Na presence ratio ($\times 10^{10}$ atoms/cm$^2$) | 0.5 | 10 | 100 | 1000 | 10000 | 12000 |
| Device yield (%) | 68 | 67 | 65 | 63 | 62 | 57 |

As shown in Table 5, yield exceeding 60% was achieved in samples 1 to 5 in which sodium atoms were present in the substrate main surface at not more than $10000 \times 10^{10}$ atoms/cm$^2$. Thus, it can be said that sodium atoms are preferably present in the substrate main surface at not more than $10000 \times 10^{10}$ atoms/cm$^2$. In addition, in order to further improve the yield, it can be said that sodium atoms are present in the substrate main surface preferably at not more than $1000 \times 10^{10}$ atoms/cm$^2$, and more preferably at not more than $100 \times 10^{10}$ atoms/cm$^2$, further at not more than $10 \times 10^{10}$ atoms/cm$^2$.

Example 7

An experiment was conducted to investigate the influence of a total presence ratio of copper atoms and zinc atoms in a main surface of a silicon carbide substrate on yield of devices. Specifically, six substrates having different total presence ratios of copper atoms and zinc atoms in main surfaces thereof were prepared, and a plurality of devices were fabricated for each substrate as in Example 1. Then, operation of the fabricated devices was checked to investigate yield thereof. Using the composite substrate in Example 1, the total amount of copper atoms and zinc atoms in a surface was controlled by changing a chemical solution or the like in the cleaning step. Table 6 shows results of the experiment.

TABLE 6

| | 1 | 2 | 3 | 4 | 5 | 6 |
|---|---|---|---|---|---|---|
| S presence ratio ($\times 10^{10}$ atoms/cm$^2$) | 1800 | 1800 | 1800 | 1800 | 1800 | 1800 |
| O presence ratio (at %) | 24 | 24 | 24 | 24 | 24 | 24 |
| Cu + Zn presence ratio ($\times 10^{10}$ atoms/cm$^2$) | 0 | 10 | 100 | 1000 | 6000 | 8000 |
| Device yield (%) | 68 | 66 | 64 | 61 | 60 | 56 |

As shown in Table 6, yield of not less than 60% was achieved in samples 1 to 5 in which copper atoms and zinc atoms were present in the substrate main surface at a total of not more than $6000 \times 10^{10}$ atoms/cm$^2$. Thus, it can be said that copper atoms and zinc atoms are preferably present in the substrate main surface at a total of not more than $6000 \times 10^{10}$ atoms/cm$^2$. In addition, in order to further improve the yield, it can be said that copper atoms and zinc atoms are present in the substrate main surface preferably at a total of not more than $1000 \times 10^{10}$ atoms/cm$^2$, and more preferably at a total of not more than $100 \times 10^{10}$ atoms/cm$^2$, further at a total of not more than $10 \times 10^{10}$ atoms/cm$^2$.

The silicon carbide substrate, the semiconductor device using the substrate, and the methods for manufacturing them in accordance with the present invention are particularly advantageously applicable to a silicon carbide substrate required to reduce on-resistance and improve yield of semiconductor devices, a semiconductor device using the substrate, and methods for manufacturing them.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide substrate in which a region including at least one main surface is made of single-crystal silicon carbide, the one main surface not being covered by any other semiconductor layer,
    sulfur atoms being present in said one main surface at not less than $60 \times 10^{10}$ atoms/cm$^2$ and not more than $900 \times 10^{10}$ atoms/cm$^2$, oxygen atoms being present in said one main surface at not less than 3 at % and not more than 30 at % and a diameter of said silicon carbide substrate being not less than 125 mm.

2. The silicon carbide substrate according to claim 1, wherein chlorine atoms are present in said one main surface at not more than $4000 \times 10^{10}$ atoms/cm$^2$.

3. The silicon carbide substrate according to claim 1, wherein carbon atoms are present in said one main surface at not less than 40 at % and not more than 60 at %.

4. The silicon carbide substrate according to claim 1, wherein a metal impurity is present in said one main surface at not more than $11000 \times 10^{10}$ atoms/cm$^2$.

5. The silicon carbide substrate according to claim 1, wherein a metal impurity is present in said one main surface at not more than $4000 \times 10^{10}$ atoms/cm$^2$.

6. The silicon carbide substrate according to claim 1, wherein sodium atoms are present in said one main surface at not more than $10000 \times 10^{10}$ atoms/cm$^2$.

7. The silicon carbide substrate according to claim 1, wherein copper atoms and zinc atoms are present in said one main surface at a total of not more than $6000 \times 10^{10}$ atoms/cm$^2$.

8. The silicon carbide substrate according to claim 1, wherein said one main surface has a surface roughness of not more than 0.5 nm when evaluated in RMS.

9. The silicon carbide substrate according to claim 1, wherein
said single-crystal silicon carbide has a 4H structure, and
said one main surface has an off angle of not less than 0.1° and not more than 10° relative to a {0001} plane of said single-crystal silicon carbide.

10. The silicon carbide substrate according to claim 1, wherein
said single-crystal silicon carbide has a 4H structure, and
said one main surface has an off angle of not less than 0.01° and not more than 6° relative to a (000-1) plane of said single-crystal silicon carbide.

11. The silicon carbide substrate according to claim 1, wherein
said single-crystal silicon carbide has a 4H structure, and
said one main surface has an off angle of not more than 4° relative to a {03-38} plane of said single-crystal silicon carbide.

12. The silicon carbide substrate according to claim 1, comprising:
a base layer; and
a single-crystal silicon carbide layer formed on said base layer,
wherein said one main surface is a surface of said single-crystal silicon carbide layer on a side opposite to a side facing said base layer.

13. A semiconductor device, comprising:
a silicon carbide substrate;
an epitaxial growth layer formed on one main surface of said silicon carbide substrate; and
an electrode formed on said epitaxial growth layer,
said silicon carbide substrate being a silicon carbide substrate as recited in claim 1.

14. The semiconductor device according to claim 13, further comprising a second electrode formed on the other main surface of said silicon carbide substrate as a main surface on a side opposite to a side facing said epitaxial growth layer.

* * * * *